(12) United States Patent  
Kumar et al.

(10) Patent No.: US 7,800,420 B2
(45) Date of Patent: Sep. 21, 2010

(54) POWER DETECTION SYSTEM AND CIRCUIT FOR HIGH VOLTAGE SUPPLY AND LOW VOLTAGE DEVICES

(75) Inventors: Pankaj Kumar, Karnataka (IN); Pramod Elamannu Parameswaran, Karnataka (IN); Anuroop Iyengar, Karnataka (IN); Vani Deshpande, Karnataka (IN)

(73) Assignee: LSI Corporation, Milpitas, CA (US)

( * ) Notice: Subject to any disclaimer, the term of this patent is extended or adjusted under 35 U.S.C. 154(b) by 89 days.

(21) Appl. No.: 12/346,900

(22) Filed: Dec. 31, 2008

(65) Prior Publication Data

US 2010/0164591 A1     Jul. 1, 2010

(51) Int. Cl.
*H03L 7/00* (2006.01)
(52) U.S. Cl. .................. 327/143; 327/77; 327/80; 327/81
(58) Field of Classification Search ............. 327/143, 327/77, 78, 80–82, 85, 88
See application file for complete search history.

(56) References Cited

U.S. PATENT DOCUMENTS 5,886,549 A * 3/1999 Naura ................. 327/143
6,157,227 A * 12/2000 Giovinazzi et al. ....... 327/143

* cited by examiner

*Primary Examiner*—Long Nguyen
(74) *Attorney, Agent, or Firm*—Prakash Nama; Global IP Services, PLLC

(57) ABSTRACT

A power detect system and circuit for detecting a voltage level of an input/output supply voltage (VDDIO) in a circuit of low voltage devices is disclosed. In one embodiment, the power detect system and circuit includes a voltage divider coupled between the VDDIO and a negative supply voltage (VSS) for generating a bias voltage, a first inverter coupled between a core voltage (VDD) and the VSS for generating a first node voltage based on the bias voltage, a native device coupled between the VDDIO and the VSS for generating a second node voltage based on the bias voltage, and a switch coupled between the first inverter and the native device for controlling the second node voltage based on the first node voltage. The power detect system further includes a second inverter coupled between the VDD and the VSS for generating an output voltage based on the second node voltage.

20 Claims, 4 Drawing Sheets

POWER DETECTION SYSTEM AND CIRCUIT FOR HIGH VOLTAGE SUPPLY AND LOW VOLTAGE DEVICES

FIELD OF TECHNOLOGY

Embodiments of the present invention relate to the field of electronics. More particularly, embodiments of the present invention relate to power detection logic.

BACKGROUND

In the semiconductor device manufacturing industry, two oxide processes rather than triple gate oxide processes are predominantly used due to their accompanying advantages, which include low manufacturing costs among other factors. Low voltage thin gate oxide transistors, which are manufactured based on the two oxide processes, often interface with a high input/output (I/O) power supply or VDDIO. For example, the low voltage thin gate oxide transistors may operate at 1.8 volts with 10 percent reliability limit and interface (e.g., using a input receiver) with a VDDIO of 2.5 to 3.3 volt (e.g., using a voltage regulator).

However, the reliability of one or more devices in a chip may be threatened when it directly interfaces with an external signal from another chip of a higher power level if the power which needs to support the interface means (e.g., the input receiver) is absent or the power level is improperly set. Further, the reliable operation of the devices may not be possible if the power level supplied by the VDDIO realized by the voltage regulator is not adequate. For example, typically 70 percent (e.g., 2.3 volts) of the target power level (e.g., 3.3 volts) may be needed for the devices to operate reliably.

Currently, power-good detect circuitry is used to detect the power level generated by the voltage regulator. The power-good detect circuitry typically comprises a band gap and a comparator. A reference voltage is one input to the comparator and an output of the voltage regulator is another input to the comparator. Based on the inputs, the power-good detect circuitry decides whether the power level is ramped adequately, which is typically at 70% of the target voltage. However, the existing power-good detect circuitry is rather complex to implement since it needs a number of components and a complex design.

SUMMARY

A power detection system and circuit for high voltage supply and low voltage devices is disclosed. In one aspect, a power detect system for detecting a voltage level of an input/output supply voltage (VDDIO) in a circuit of low voltage devices includes a voltage divider coupled between the VDDIO and a negative supply voltage (VSS) for generating a bias voltage. For example, the low voltage devices are implemented using 1.8 volts thinner gate oxide transistors which have a reliability limit of 10%.

Further, the voltage divider includes a first resistor and a second resistor, and each of the first resistor and the second resistor is formed using a polysilicon resistor. Further, the bias voltage is based on a ratio between the first resistor and the second resistor. In one embodiment, the bias voltage sets a trip point for the VDDIO.

The power detect system further includes a first inverter coupled between a core voltage (VDD) and the VSS for generating a first node voltage based on the bias voltage. The first inverter includes a first PMOS transistor and a first NMOS transistor. For example, the VDDIO includes a voltage between 1.8 volts and 3.3 volts, and the VDD includes a voltage between 0.9 volt and 1.8 volts, and the VDD is less than the VDDIO.

The power detect system also includes a native device coupled between the VDDIO and the VSS for generating a second node voltage based on the bias voltage. Further, the native device is coupled to the VDDIO via a third resistor, and the native device includes a second NMOS transistor with zero threshold value.

Furthermore, the power detect system includes a switch coupled between the first inverter and the native device for controlling the second node voltage based on the first node voltage. The switch includes a third NMOS transistor. In operation, controlling the second node voltage includes coupling the second node voltage to the VSS if the bias voltage is less than zero and decoupling the second node voltage from the VSS if the bias voltage is greater than zero.

Moreover, the power detect system includes a second inverter coupled between the VDD and the VSS for generating an output voltage based on the second node voltage. The second inverter includes a second PMOS transistor and a fourth NMOS transistor. As a consequence of controlling the second node voltage, the low voltage devices are maintained within their reliability limits.

The systems and apparatuses disclosed herein may be implemented in any means for achieving various aspects. Other features will be apparent from the accompanying drawings and from the detailed description that follows.

BRIEF DESCRIPTION OF THE DRAWINGS

Embodiments of the present invention are illustrated by way of an example and not limited to the figures of the accompanying drawings, in which like references indicate similar elements and in which.

Other features of the present embodiments will be apparent from the accompanying drawings and from the detailed description that follows.

DETAILED DESCRIPTION

A power detection system and circuit for high voltage supply and low voltage devices is disclosed. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
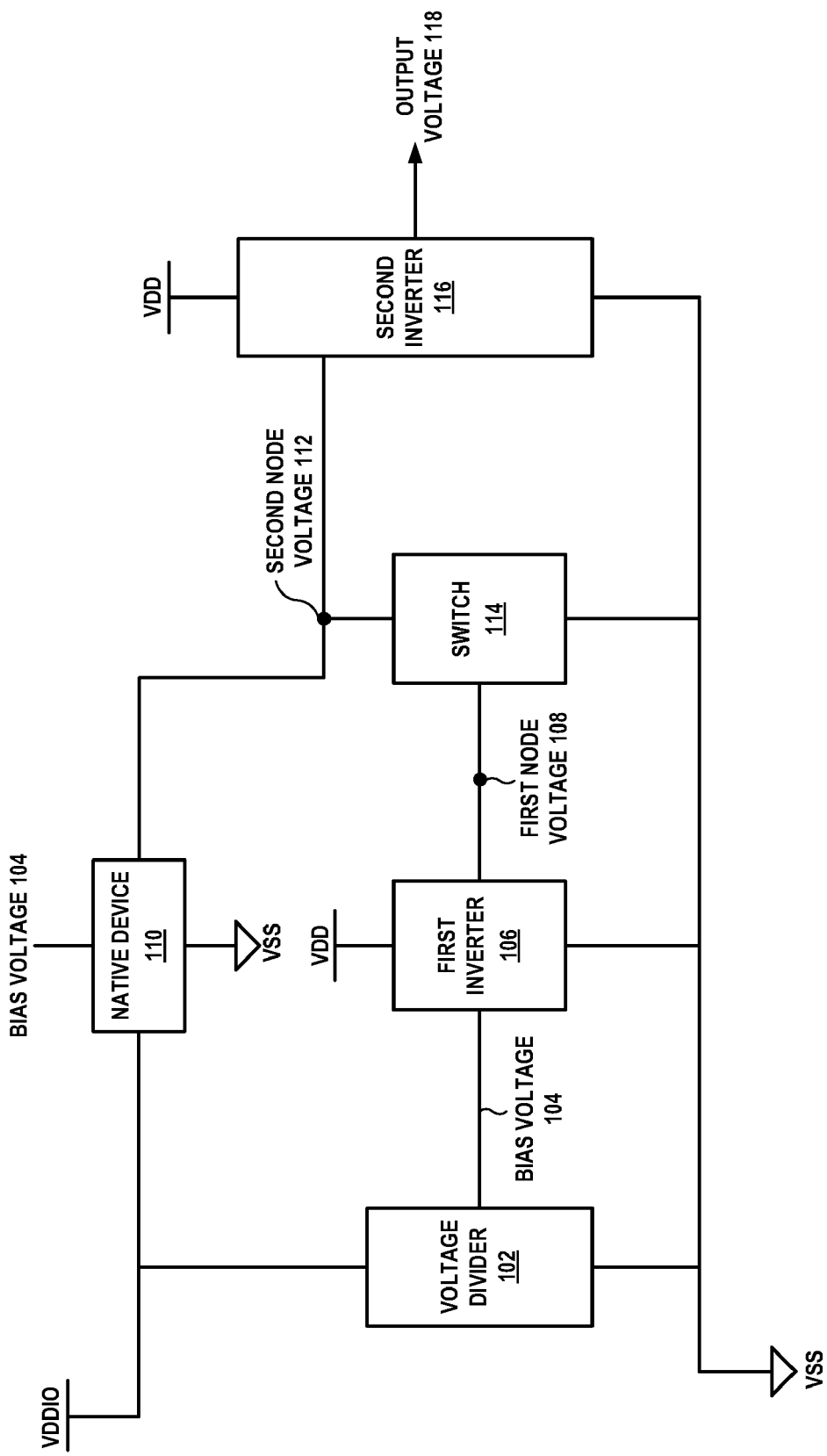
FIG. 1 is a block diagram of an exemplary power detect system, according to one embodiment.

FIG. 1 is a block diagram of an exemplary power detect system 100, according to one embodiment. Particularly, FIG. 1 illustrates the power detect system 100 for detecting a voltage level of an input/output supply voltage (VDDIO) in a circuit of low voltage devices. In one example embodiment, the VDDIO includes a voltage between 1.8 volts and 3.3 volts. It is appreciated that, the low voltage devices are implemented using 1.8 volts thinner gate oxide transistors which have reliability limit of the order of 10%. As shown in FIG. 1, the power good detect system includes a voltage divider 102, a first inverter 106, a native device 110, a switch 114, and a second inverter 116.

Further as shown in FIG. 1, the voltage divider 102 is coupled between the VDDIO and the negative supply voltage (VSS) for generating a bias voltage 104. Furthermore, the first inverter 106 is coupled between a core voltage (VDD) and the VSS for generating a first node voltage 108 based on the bias voltage 104. In one example embodiment, the VDD includes a voltage between 0.9 volt and 1.8 volts. In another example embodiment, the VDD is less than the VDDIO.

As shown in FIG. 1 the native device 110 is coupled between the VDDIO and the VSS (e.g., also coupled between the VDDIO and the switch 114) for generating a second node voltage 112 based on the bias voltage 104. In addition, the switch 114 is coupled between the first inverter 106 and the native device 110 for controlling the second node voltage 112 based on the first node voltage 108. Further as shown in FIG. 1, the second inverter 116 is coupled between the VDD and the VSS for generating an output voltage 118 based on the second node voltage 112.

In operation, the controlling the second node voltage 112 includes coupling the second node voltage 112 to the VSS if the bias voltage 104 is less than zero, and decoupling the second node voltage 112 from the VSS if the bias voltage 104 is greater than zero. It is appreciated that the trip point here is not zero but a voltage determined by the threshold voltage (Vt) of the MOS devices. In one exemplary implementation, the bias voltage 104 sets a trip point for the VDDIO. As a consequence, the low voltage devices are maintained within their reliability limits.

Figure 2:
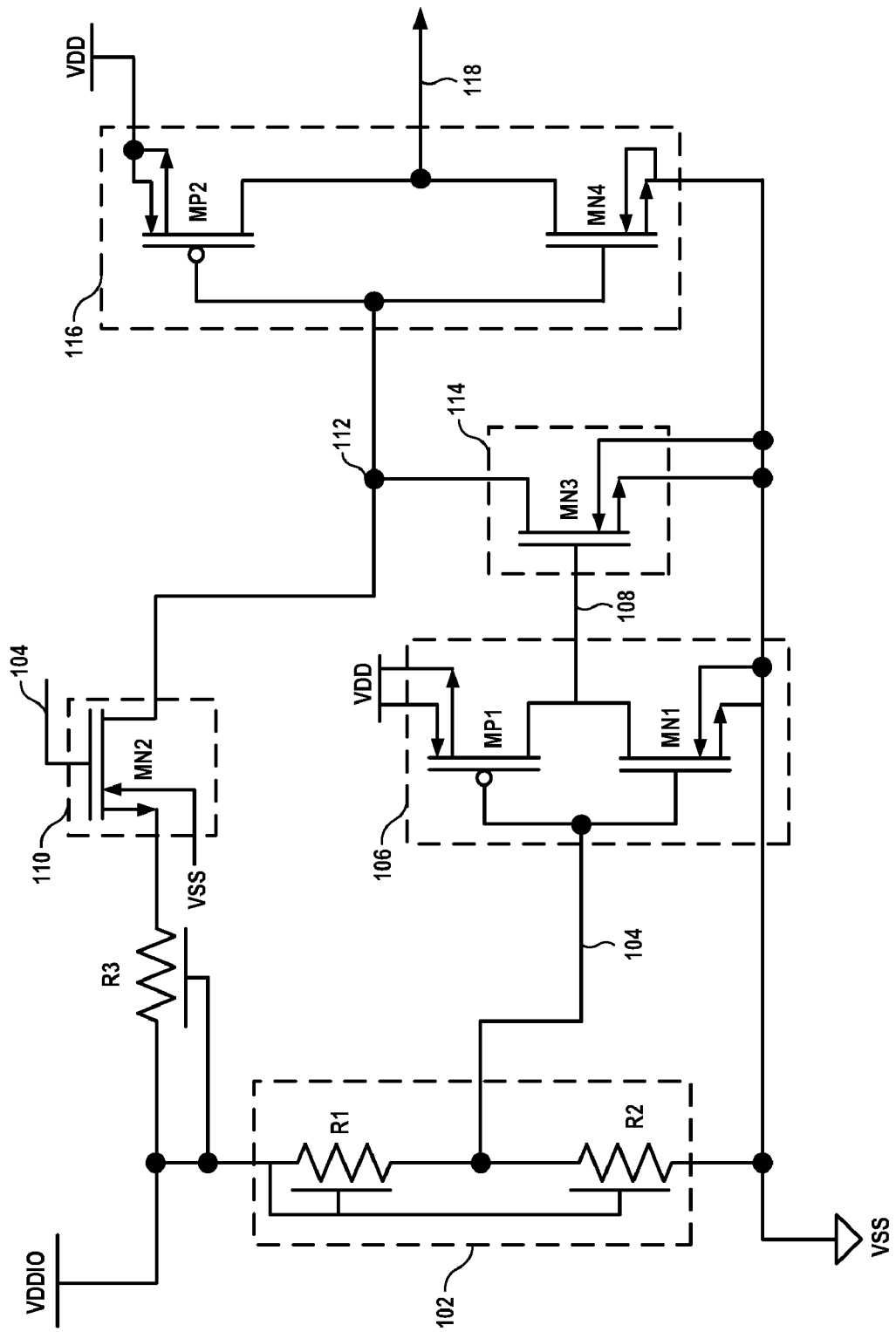
FIG. 2 is a block diagram of an exemplary power detect circuit, according to one embodiment.

FIG. 2 is a block diagram of an exemplary power detect circuit 200, according to one embodiment. Particularly, FIG. 2 illustrates the power detect circuit 200 for detecting a voltage level of the VDDIO in a circuit of low voltage devices.

As shown in FIG. 2, the power detect circuit 200 includes the voltage divider 102 coupled between the VDDIO and the negative supply voltage (VSS) for generating the bias voltage 104. In one exemplary implementation, the voltage divider 102 includes a first resistor (R1) and a second resistor (R2). In one example embodiment, each of the R1 and the R2 is formed using a polysilicon resistor. In one embodiment, the bias voltage 104 is generated based on a ratio between the R1 and the R2. It is appreciated that, the bias voltage 104 sets a trip point for the VDDIO.

Further, the power detect circuit 200 includes the first inverter 106 coupled between the core voltage (VDD) and the VSS for generating the first node voltage 108 based on the bias voltage 104. In one exemplary implementation, the first inverter includes a first PMOS transistor (MP1) and a first NMOS transistor (MN1).

The power detect circuit 200 also includes the native device 110 coupled between the VDDIO and the VSS for generating the second node voltage 112 based on the bias voltage 104. In one exemplary implementation, the native device 110 includes a second NMOS transistor (MN2) with zero threshold value. In one example embodiment, the native device 110 is coupled to the VDDIO via a third resistor R3.

The power detect circuit 200 further includes the switch 114 coupled between the first inverter 106 and the native device 110 for controlling the second node voltage 112 based on the first node voltage 108. In one exemplary implementation, the switch 114 includes a third NMOS transistor (MN3). In one embodiment, the second node voltage 112 is coupled to the VSS if the bias voltage 104 is less than zero, and the second node voltage 112 is decoupled from the VSS if the bias voltage 104 is greater than zero.

The power detect circuit 200 further includes the second inverter 116 coupled between the VDD and the VSS for generating the output voltage 118 based on the second node voltage 112. In one exemplary implementation, the second inverter 116 includes a second PMOS transistor (MP2) and a fourth NMOS transistor (MN4).

For example, when the VDDIO is present, the power detect circuit 200 works as follows. In one exemplary implementation, the bias voltage 104 is maintained at VDDIO/2 based on the ratio of the first resistor R1 and the second resistor R2. In one example embodiment, the VDDIO includes a voltage between 1.8 volts and 3.3 volts and the VDD includes a voltage between 0.9 volt and 1.8 volts.

In one exemplary implementation, the BIAS voltage 104 is maintained at VDDIO/2 (e.g., high) by using equal resistance values for R1 and R2. It is appreciated that, the value of R1 and R2 are chosen based on a value at which the voltage level of the VDDIO is to be detected. The first inverter 106 with the MP1 and the MN1 then discharges the first node voltage 108 (since the bias voltage 104 is high), and the first node voltage goes low. As a consequence, the MN3 is disabled. In other words, the MN3 is not driven (e.g., OFF) since the first node voltage 108 is going low. Therefore, the voltage at the second node voltage 112 is directly driven by the native device 110. Since MN2 is used as the native device 110, the second node voltage 112 is set to the bias voltage 104, e.g., VDDIO/2.

Further, the second inverter 116 with the MP2 and the MN4 generates the output voltage 118 based on the second node voltage 112. Since the second node voltage is equal to the bias voltage 104, the second inverter 116 generates the output voltage 118 as low which indicates the presence of the VDDIO. In one embodiment, the power detect circuit 200 ensures that the MN2, MN3, MN4 and MP2 are out of stress as voltage across the two terminals are maintained at less than 1.98 volts at any stage.

Similarly, when the VDDIO is absent, the power detect circuit 200 works as follows. The bias voltage 104 becomes zero, since the VDDIO is absent. The first inverter 106 with the MP1 and the MN1 charges the first node voltage 108 to VDD and the first node voltage goes high. As a consequence, the MN3 is enabled. In one example embodiment, the MN3 is driven (e.g., ON) since the first node voltage 108 is rendered high.

Therefore, the voltage at the second node voltage 112 is slowly discharged. Further, the second inverter 116 with the MP2 and the MN4 charges the output voltage 118 to VDD. This voltage level at the output voltage 118 indicates that VDD is present and VDDIO is absent. Thus, the power detect circuit 200 again ensures that the MN2, MN3, MN4 and MP2 are out of stress as voltage across the two terminals are maintained at less than 1.98 volts at any stage.

Figure 3:
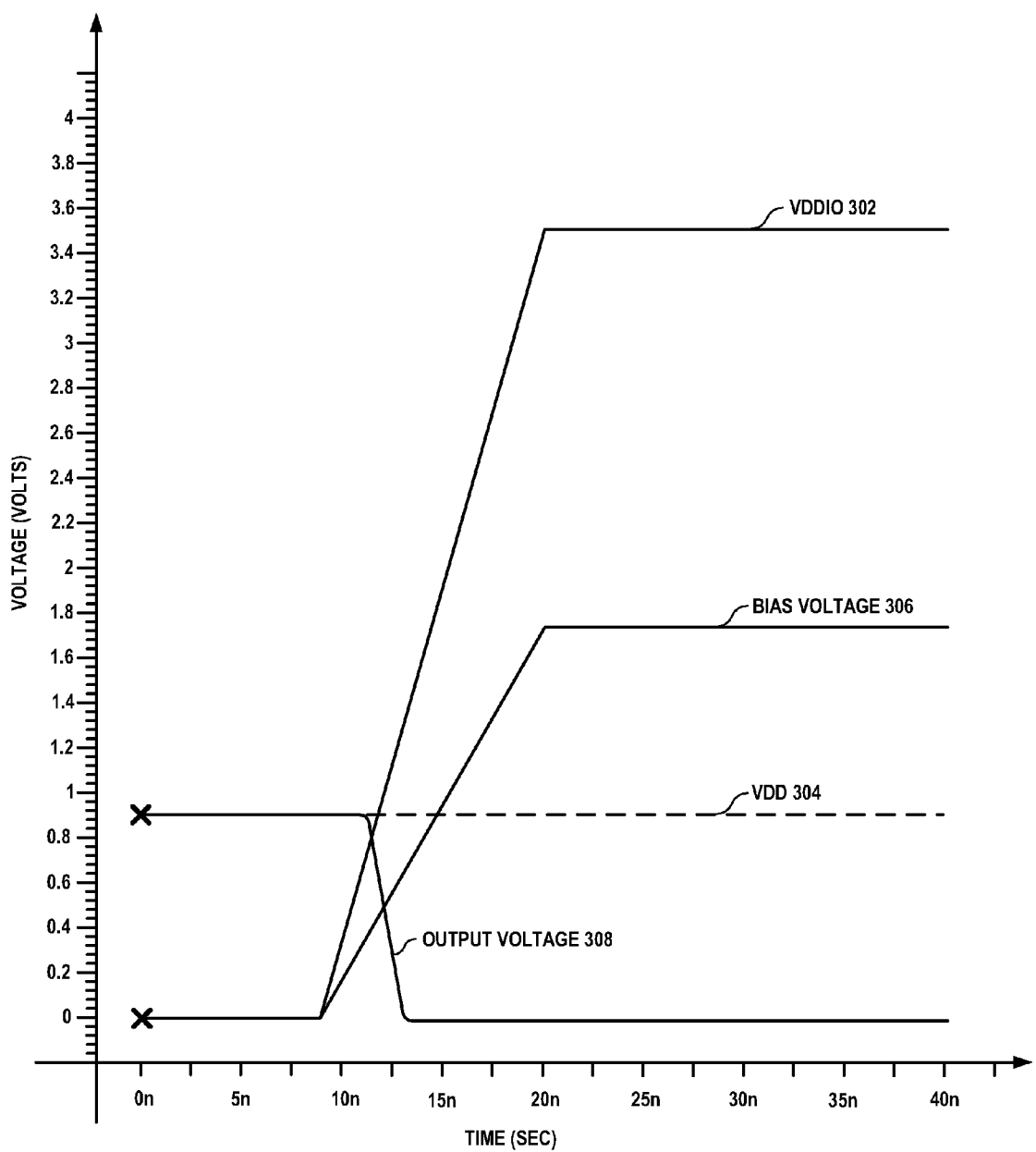
FIG. 3 is an exemplary graphical diagram which illustrates an exemplary operation of the power detect system and/or circuit of FIGS. 1 and 2 with an exemplary trigger point, according to one embodiment.

FIG. 3 is an exemplary graphical diagram 300 which illustrates an exemplary operation of the power detect system 100 and/or circuit 200 of FIGS. 1 and 2 with an exemplary trigger point, according to one embodiment. Particularly, FIG. 3 illustrates setting the bias voltage 104 based on a ratio between the R1 and the R2. It is appreciated that, the bias voltage 104 further sets a trip point for the VDDIO.

As shown in FIG. 3, curve 302 illustrates the voltage versus time characteristics of the VDDIO, curve 304 illustrates the voltage versus time characteristics of the VDD, curve 306 illustrates the voltage versus time characteristics of the bias voltage 104, and curve 308 illustrates the voltage versus time characteristics of the output voltage 118.

In the example embodiment illustrated in FIG. 3, the VDDIO and the VDD are set at a voltage of around 3.4 volts and 0.9 volts respectively. Further, the bias voltage 104 is generated at around 1.7 volts (e.g., VDDIO/2) by selecting the R1 and R2 values of 9.2K ohms each. In one embodiment, the power detect system 100 and/or the power detect circuit 200 of FIGS. 1 and 2 detects the presence of VDDIO in the range of 20-30% while ramping as illustrated in FIG. 3. In other words, the output voltage goes low (e.g., 0) at 20-30% of the ramping VDDIO voltage as illustrated in the curve 308, thereby detecting the presence of VDDIO. In another example embodiment, the trip point can be changed by changing the bias voltage 104 as illustrated in FIG. 4.

Figure 4:
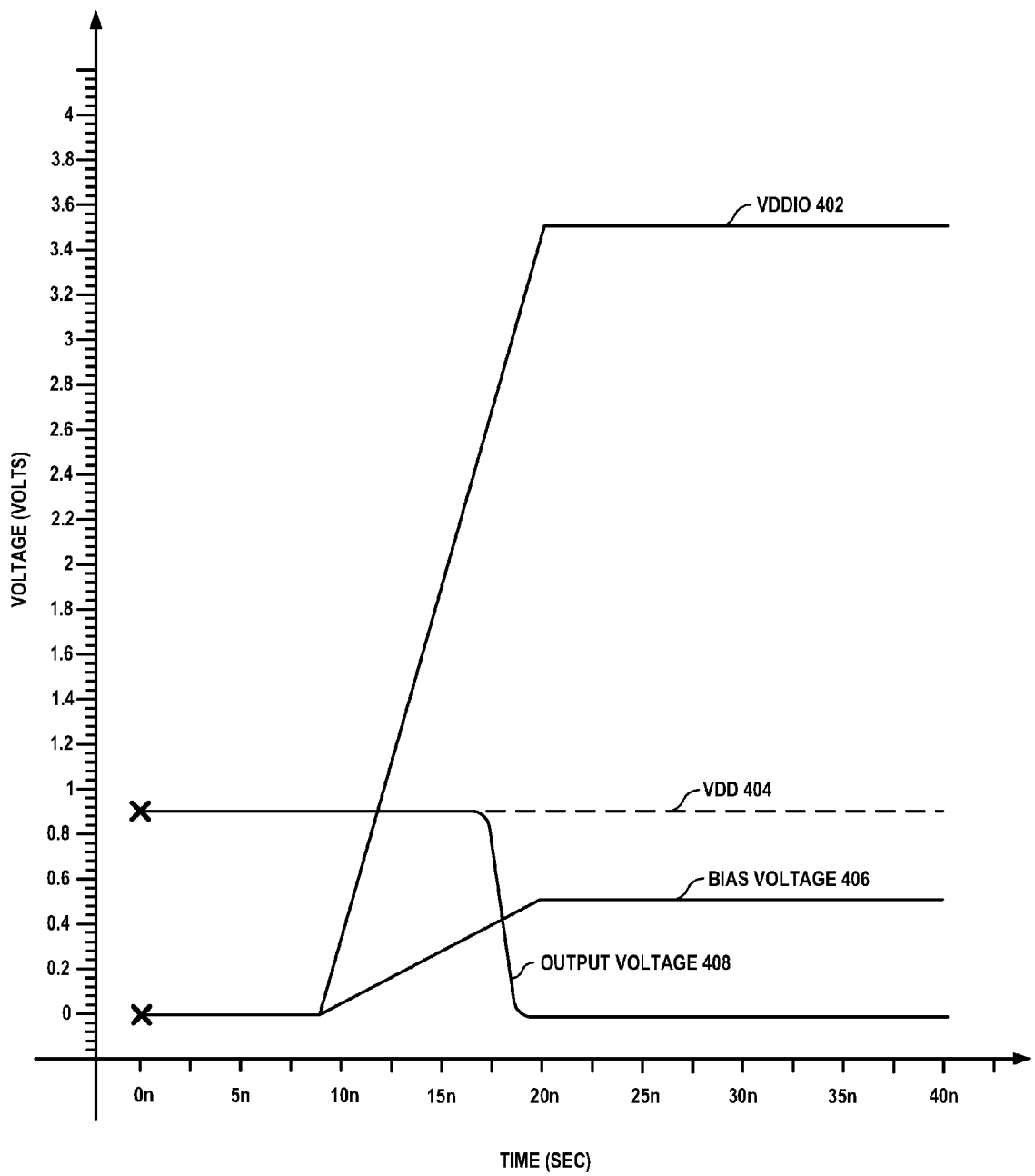
FIG. 4 is an exemplary graphical diagram which illustrates an exemplary operation of the power detect system and/or circuit of FIGS. 1 and 2 with another exemplary trigger point, according to one embodiment.

FIG. 4 is an exemplary graphical diagram 400 which illustrates an exemplary operation of the power detect system and/or circuit of FIGS. 1 and 2 with another exemplary trigger point, according to one embodiment. Particularly, curve 402 illustrates the voltage versus time characteristics of the VDDIO, curve 404 illustrates the voltage versus time characteristics of the VDD, curve 406 illustrates the voltage versus time characteristics of the bias voltage 104, and curve 408 illustrates the voltage versus time characteristics of the output voltage 118.

In the example embodiment illustrated in FIG. 4, the VDDIO and the VDD are set at a voltage of around 3.4 volts and 0.9 volts respectively. Further, the bias voltage 104 is generated at around 0.6 volts by selecting the R1 and R2 values of 9.24K ohms and 1.68K ohms respectively, as shown in exemplary graphical diagram 400. In this case, the power detect system 100 and/or the power detect circuit 200 of FIGS. 1 and 2 detects the presence of VDDIO in the range of 70-80% while ramping. In other words, the output voltage goes low (e.g., 0) at 70-80% of the ramping VDDIO voltage as illustrated in the curve 408, detecting the presence of VDDIO. Therefore, it is appreciated that the trip point can be set based on the bias voltage 104 generated through the R1 and R2 in the voltage divider 102.

The above described power detect system 100 and/or the power detect circuit 200 for the low voltage devices can be implemented using 1.8 volts thinner gate oxide IO device, which has a reliability limit of 1.98 volts across any two terminals. Further, the above described power detect system 100 and/or the power detect circuit 200 can be used for higher voltage supply with lower voltage devices without reliability concern. The above described power detect system 100 and/or the power detect circuit 200 can also be used for various combinations of higher and lower voltage supply.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated circuitry (ASIC)).

What is claimed is:

1. A power detect system for detecting a voltage level of an input/output supply voltage (VDDIO) in a circuit of low voltage devices, comprising:
   a voltage divider coupled between the VDDIO and a negative supply voltage (VSS) for generating a bias voltage;
   a first inverter coupled between a core voltage (VDD) and the VSS for generating a first node voltage based on the bias voltage;
   a native device coupled between the VDDIO and the VSS for generating a second node voltage based on the bias voltage; and
   a switch coupled between the first inverter and the native device for controlling the second node voltage based on the first node voltage.

2. The system of claim 1, wherein the VDDIO comprises a voltage between 1.8 volts and 3.3 volts.

3. The system of claim 2, wherein the VDD comprises a voltage between 0.9 volt and 1.8 volts, and wherein the VDD is less than the VDDIO.

4. The system of claim 1, wherein the voltage divider comprises a first resistor and a second resistor.

5. The system of claim 4, wherein each of the first resistor and the second resistor is formed using a polysilicon resistor.

6. The system of claim 4, wherein the bias voltage is based on a ratio between the first resistor and the second resistor.

7. The system of claim 1, wherein the bias voltage sets a trip point for the VDDIO.

8. The system of claim 1, wherein the low voltage devices are implemented using 1.8 volts thinner gate oxide transistors which have a reliability limit of 10%.

9. The system of claim 1, wherein the first inverter comprises a first PMOS transistor and a first NMOS transistor.

10. The system of claim 1, wherein the native device is coupled to the VDDIO via a third resistor.

11. The system of claim 1, wherein the native device comprises a second NMOS transistor with zero threshold value.

12. The system of claim 1, wherein the switch comprises a third NMOS transistor.

13. The system of claim 1, wherein the controlling the second node voltage comprises coupling the second node voltage to the VSS if the bias voltage is less than zero and decoupling the second node voltage from the VSS if the bias voltage is greater than zero.

14. The system of claim 1, further comprising a second inverter coupled between the VDD and the VSS for generating an output voltage based on the second node voltage.

15. The system of claim 14, wherein the second inverter comprises a second PMOS transistor and a fourth NMOS transistor.

16. The system of claim 1, wherein the low voltage devices are maintained within their reliability limits.

17. A power detect circuit for detecting a voltage level of an input/output supply voltage (VDDIO) in a circuit of low voltage devices, comprising:
   a voltage divider coupled between the VDDIO and a negative supply voltage (VSS) for generating a bias voltage, the voltage divider including a first resistor and a second resistor;
   a first inverter coupled between a core voltage (VDD) and the VSS for generating a first node voltage based on the bias voltage, the first inverter including a first PMOS transistor and a first NMOS transistor;
   a native device coupled between the VDDIO and the VSS for generating a second node voltage based on the bias voltage, the native device including a second NMOS transistor with zero threshold value; and a switch coupled between the first inverter and the native device for controlling the second node voltage based on the first node voltage, the switch including a third NMOS transistor.

18. The circuit of claim 17, further comprising a second inverter coupled between the VDD and the VSS for generating an output voltage based on the second node voltage, the second inverter including a second PMOS transistor and a fourth NMOS transistor.

19. A power detect system for detecting a voltage level of an input/output supply voltage (VDDIO) in a circuit of low voltage devices, comprising:

a voltage divider coupled between the VDDIO and a negative supply voltage (VSS) for generating a bias voltage;

a first inverter coupled between a core voltage (VDD) and the VSS for generating a first node voltage based on the bias voltage;

a native device coupled between the VDDIO and the VSS for generating a second node voltage based on the bias voltage;

a switch coupled between the first inverter and the native device for controlling the second node voltage based on the first node voltage; and a second inverter coupled between the VDD and the VSS for generating an output voltage based on the second node voltage.

20. The system of claim 19, wherein the bias voltage sets a trip point for the VDDIO.

\* \* \* \* \*